United States Patent
Hong

(10) Patent No.: US 7,364,936 B2
(45) Date of Patent: Apr. 29, 2008

(54) CMOS IMAGE SENSOR AND METHOD FOR FABRICATING THE SAME

(75) Inventor: Chang Young Hong, Namyangju (KR)

(73) Assignee: Dongbu Electronics Co., Ltd, Seoul (KR)

(*) Notice: Subject to any disclaimer, the term of this patent is extended or adjusted under 35 U.S.C. 154(b) by 296 days.

(21) Appl. No.: 11/250,475

(22) Filed: Oct. 17, 2005

(65) Prior Publication Data

US 2006/0081955 A1    Apr. 20, 2006

(30) Foreign Application Priority Data

Oct. 18, 2004    (KR) .................. 10-2004-0083062

(51) Int. Cl.
*H01L 21/00*    (2006.01)
(52) U.S. Cl. .................. 438/70; 438/57; 438/65; 438/73
(58) Field of Classification Search .................. 438/65, 438/70, 57, 73
See application file for complete search history.

(56) References Cited

U.S. PATENT DOCUMENTS 6,979,588 B2*  12/2005  Jeong et al. .................. 438/70

FOREIGN PATENT DOCUMENTS

KR    10-20020048707 A    6/2002

* cited by examiner

*Primary Examiner*—Douglas M. Menz
(74) *Attorney, Agent, or Firm*—McKenna Long & Aldridge LLP

(57) ABSTRACT

A CMOS image sensor and a method for fabricating the same improve photosensitivity by imparting a color filter layer with the function of a microlens layer. The CMOS image sensor includes a semiconductor substrate; a plurality of photo-sensing elements formed in the semiconductor substrate; and a color filter layer comprised of a plurality of color filters for filtering light according to wavelength, wherein the plurality of color filters correspond to the plurality of photo-sensing elements and each color filter has a predetermined curvature for focusing light and for transmitting the focused light according to a corresponding wavelength.

7 Claims, 4 Drawing Sheets

CMOS IMAGE SENSOR AND METHOD FOR FABRICATING THE SAME

CROSS-REFERENCE TO RELATED APPLICATIONS

This application claims the benefit of Korean Patent Application No. 10-2004-0083062, filed on Oct. 18, 2004, which is hereby incorporated by reference for all purposes as if fully set forth herein.

BACKGROUND OF THE INVENTION

1. Field of the Invention

The present invention relates to a CMOS image sensor, and more particularly, to a CMOS image sensor and a method for fabricating the same. The CMOS image sensor improves photosensitivity by providing a color filter layer having a microlens function and by eliminating the need for a microlens photoresist layer.

2. Discussion of the Related Art

An image sensor is a semiconductor device for converting an optical image into an electrical signal and may be broadly categorized as a charge-coupled device (CCD) or a complementary metal-oxide-semiconductor (CMOS). A CMOS image sensor comprises a photosensor for receiving light and a logic circuit for converting the received light into an electrical signal. To improve photosensitivity, the fill factor of the CMOS image sensor should be improved. That is, the area occupied by the photosensor should be increased with respect to the overall area of the entire CMOS image sensor. There is a limit to increasing the photosensor area since the CMOS image sensor itself has a finite size.

Alternatively, photosensitivity can be effectually improved by concentrating or focusing incident light onto the photosensor. Incident light on the CMOS image sensor outside the area of a photosensor is redirected to land on the photosensor. To achieve this in the related art, a microlens that corresponds to the photosensor is provided. The microlens is typically on a color filter array.

As shown in FIG. 1, a CMOS image sensor according to the related art includes a semiconductor substrate 10, an insulating interlayer 11, a color filter layer 12 formed on the insulating interlayer 11, a planarization layer 13 formed on the color filter layer 12, and a plurality of microlenses 14 formed on the planarization layer 13. The semiconductor substrate 10 includes a lower layer (not shown) of metal lines interconnected with a plurality of photodiodes generate electrical charges according to an amount of incident light. Furthermore, and the entire surface of the lower layer is covered with the insulating interlayer 11.

The color filter layer 12 is comprised of an array of red, green, and blue patterns for filtering light according to wavelength or color. Each microlens 14 is formed in a convex shape having a predetermined curvature and height for focusing light onto a corresponding photodiode through one of the patterns of the color filter layer 12. Generally, the microlenses 14 are formed of a polymer-based resin, typically, a photoresist, and can be completely formed by deposition, patterning and reflowing processes. The processes of microlens formation and color filter array formation are directly related to the color characteristics of the CMOS image sensor.

In a method for fabricating the CMOS image sensor described above, after a basic lens array pattern including a plurality of lens formation blocks is formed, each block of the lens pattern is imparted with its predetermined curvature by reflowing. Each lens formation block has a rectangular section and is separated by a fixed interval. In the reflowing process, however, it is difficult to maintain the proper interval between lenses. Moreover, due to characteristics of the material used for forming the microlens, e.g., photoresist, some of the energy of the incident light is lost or attenuated during transmission to the lower layers. The amount of light loss varies depending on wavelength. That is, about 2~5% of the light is not transmitted by the microlens material. Thus, the photosensitivity of the image sensor is reduced accordingly.

SUMMARY OF THE INVENTION

Accordingly, the present invention is directed to a CMOS image sensor and a method for fabricating the same that substantially obviates one or more of the problems due to limitations and disadvantages of the related art.

An advantage of the present invention is to provide a CMOS image sensor and a method for fabricating the same that improves photosensitivity by imparting a color filter layer with the function of a microlens layer.

Another advantage of the present invention is to provide a CMOS image sensor and a method for fabricating the same which simplifies image sensor manufacture.

Another advantage of the present invention is to provide a CMOS image sensor and a method for fabricating the same which prevents light energy loss attributable to a microlens photoresist layer.

Another advantage of the present invention is to provide a CMOS image sensor and a method for fabricating the same which enables a reduction in the overall height of a device.

Additional features and advantages of the invention will be set forth in the description which follows, and in part will be apparent from the description, or may be learned by practice of the invention. The objectives and other advantages of the invention will be realized and attained by the structure and method particularly pointed out in the written description and claims hereof as well as the appended drawings.

To achieve these and other advantages and in accordance with the purpose of the present invention, as embodied and broadly described, there is provided a CMOS image sensor comprising a semiconductor substrate; a plurality of photo-sensing elements formed in the semiconductor substrate; and a color filter layer comprised of a plurality of color filters for filtering light according to wavelength, wherein the plurality of color filters correspond to the plurality of photo-sensing elements and each color filter has a predetermined curvature for focusing light and for transmitting the focused light according to a corresponding wavelength.

In another aspect of the present invention, there is provided a CMOS image sensor comprising a microlens layer made of colored resist.

In another aspect of the present invention, there is provided a method for fabricating a CMOS image sensor. The method comprises forming a color filter layer comprised of a plurality of color filters for filtering light according to wavelength, wherein the plurality of color filters correspond to a plurality of photo-sensing elements formed in a semiconductor substrate; forming a sacrificial layer for microlens formation on the color filter layer; patterning the sacrificial layer to form a plurality of lens formation blocks corresponding to the plurality of color filters; reflowing the patterned sacrificial layer to impart each lens formation block with a predetermined curvature; and imparting each color filter of the plurality of color filters with a desired predetermined curvature corresponding to the predetermined curvature of the lens formation blocks by etching the patterned sacrificial layer and the color filter layer to completely removing the patterned sacrificial layer.

The present invention relates to a color filter array process and a microlens formation process in the fabrication of a CMOS image sensor. The present invention overcomes the problem of light energy loss which occurs when photoresist is used as the microlens material. In the CMOS image sensor according to the present invention, the color filters or patterns of the color filter layer or array each have a predetermined curvature formed by wet-etching such that the color filter layer also serves to focus the light. That is, the individual color filters of the color filter layer are each imparted with a predetermined curvature and thus perform the function of a lens in addition to color separation. Since the color filter layer is patterned as a plurality of lenses, the light can be focused as well as selectively transmitted by wavelength using a single layer. Thus, light transmissivity is improved.

The CMOS image sensor of the present invention comprises a microlens layer made of a material for forming the respective patterns of a color filer array, that is, colored resist of red, green, and blue, such that the focusing function of a conventional microlens layer is imparted to the color filter layer. Since each lens-shaped color filter of the color filter layer has the desired predetermined curvature for focusing light according to the corresponding wavelength, it is unnecessary to form an additional layer for focusing the light via each color filter of the color filter layer. That is, there is no requirement for forming a microlens photoresist layer on the color filter layer. Thus, any potential light energy loss by the microlens photoresist layer is wholly prevented.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to embodiments of the present invention, examples of which are illustrated in the accompanying drawings. Wherever possible, like reference designations will be used throughout the drawings to refer to the same or similar parts.

Figure 1:
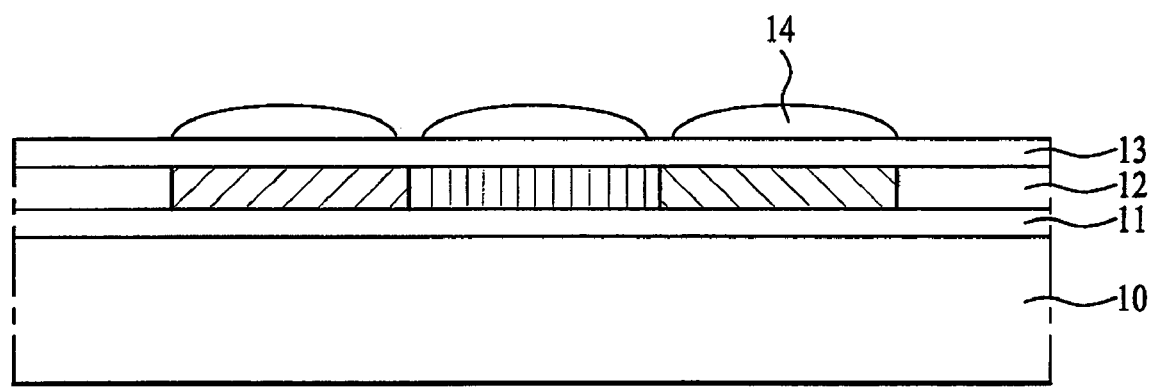
FIG. 1 is a cross-sectional view of a CMOS image sensor according to the related art.
Figure 2:
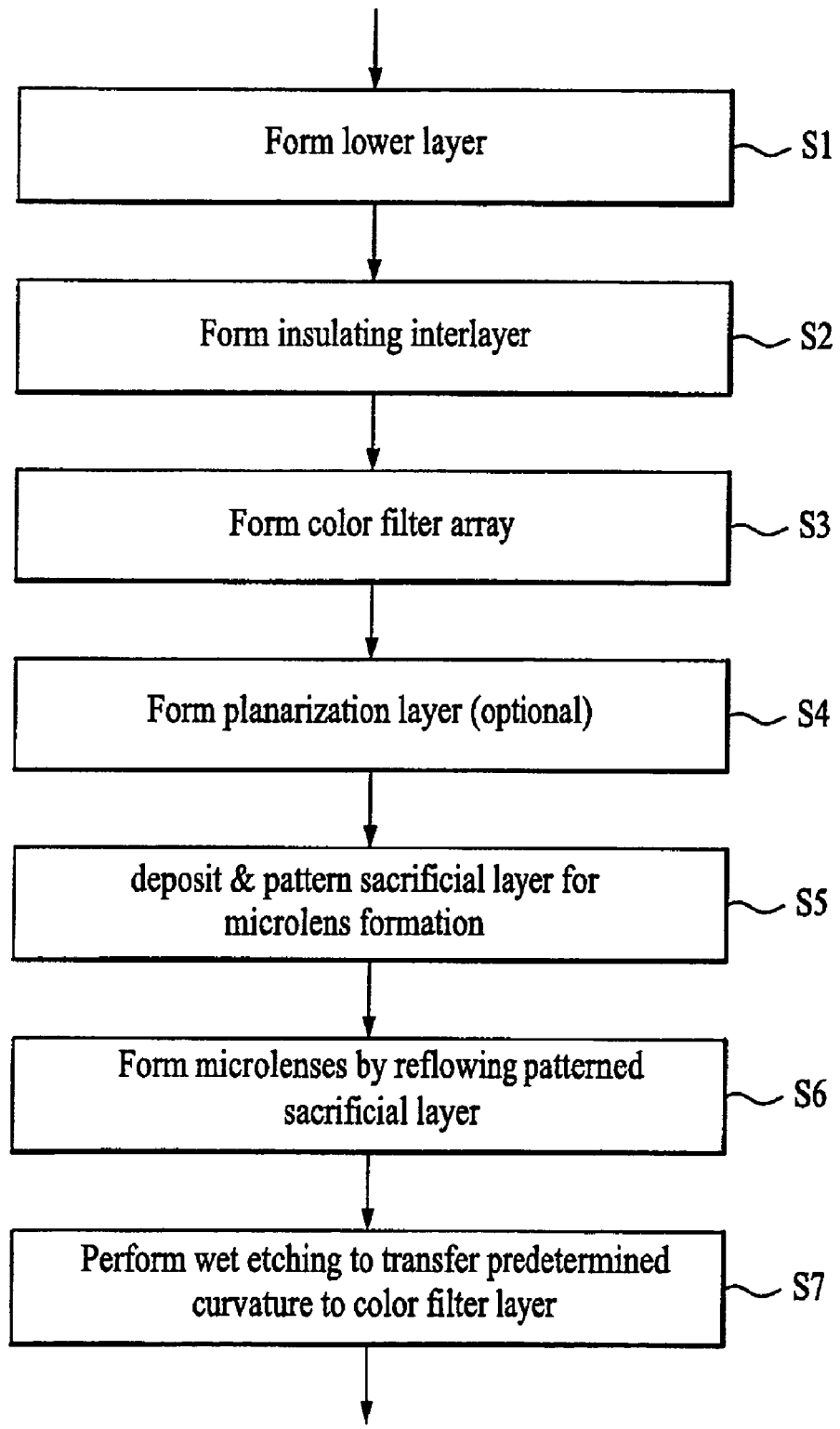
FIG. 2 is a flow chart of the process for fabricating a CMOS image sensor according to the present invention.

Referring to FIG. 2, the process steps for fabricating the CMOS image sensor according to the present invention include forming a lower layer of a plurality of photo-sensing elements, e.g. photodiodes, and a CMOS logic circuit (S1), forming an insulating interlayer to protect the lower layer (S2), forming a color filter layer including an array of color filters (S3), optionally forming a planarization layer on the color filter layer (S4), depositing and patterning a sacrificial layer for microlens formation (S5), forming a plurality of microlenses by reflowing the patterned sacrificial layer (S6), and performing wet etching to transfer a predetermined curvature to the color filter layer (S7).

FIGS. 3A-3E illustrate a method for fabricating the CMOS image sensor according to the present invention.

Figure 3A:
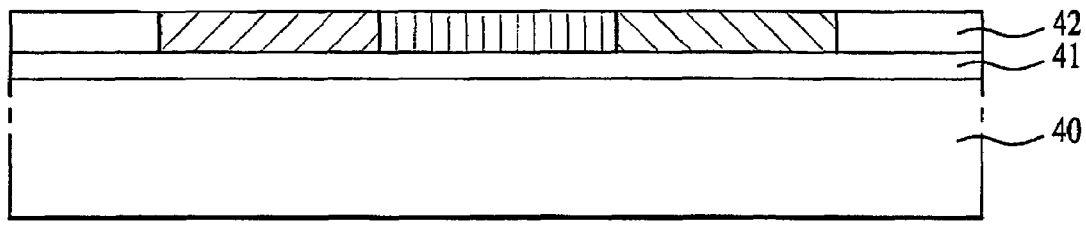
FIGS. 3A-3E are cross-sectional views of the process for fabricating a CMOS image sensor according to the present invention.

Referring to FIG. 3A, a lower layer (not shown) is formed in a semiconductor substrate 40 and an insulating interlayer 41 is formed to protect the lower layer. A planarized passivation layer (not shown) for protecting the device from moisture and abrasion is formed on the insulating interlayer. A color filter layer 42 is formed by sequentially coating the passivation layer with layers of colored photoresist, wherein each layer corresponds to each color of red, green, and blue. The respective layers of colored photoresist are then patterned to form a plurality of color filters for filtering light according to wavelength. The lower layer of the semiconductor substrate 40 includes a plurality of photodiodes, which may be in the form of a plurality of photo-gates, for generating electrical charges according to the amount of incident light. The lower layer of the semiconductor substrate 40 also includes a metal wiring layer for interconnecting the photodiodes and a CMOS logic circuit (not shown) for detecting the electrical charges and outputting an image signal according to an optical signal received by the photodiodes. The color filters of the color filter layer 42 are formed to correspond to the arrangement of the photodiodes. The insulating interlayer 41 may be formed as a multi-layered structure covering an entire surface of the lower layer. The insulating interlayer 41 may include a first insulating interlayer formed on the entire surface of the semiconductor substrate, a light-shielding layer formed on the first insulating layer for preventing light from reaching portions other than the photodiodes, and a second insulating interlayer formed on the light-shielding layer.

Figure 3B:
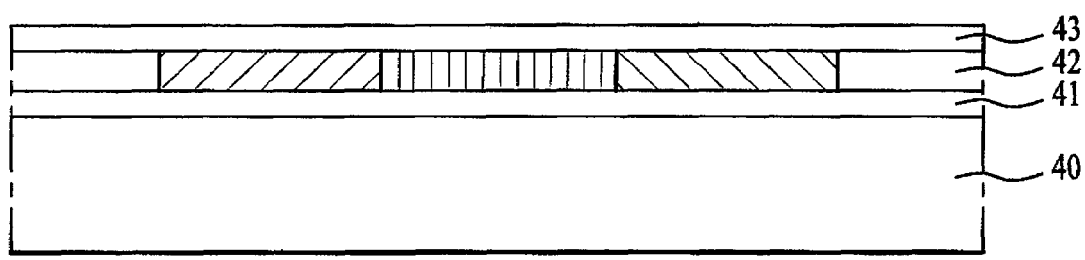

Referring to FIG. 3B, a planarization layer 43 is formed on the color filter layer 42. The planarization layer 43 provides a surface for forming a lens layer and controls a focusing distance.

Figure 3C:
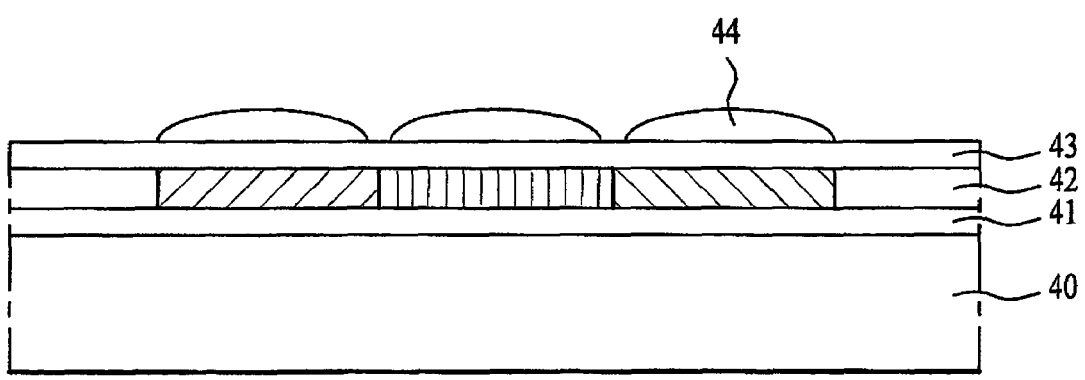

Referring to FIG. 3C, a sacrificial layer (not shown) for lens formation is formed and selectively patterned to form a plurality of lens formation blocks, wherein each block has a rectangular section and is separated by a fixed or regular interval. This forms a sacrificial layer pattern (not shown) which undergoes a reflowing process to form a lens-shaped sacrificial layer 44, wherein each lens structure is imparted with a predetermined curvature. The sacrificial layer may be formed of a photoresist material having reflow characteristics according to a thermal treatment performed with respect to the sacrificial layer pattern. The color filter layer 42 may itself be planarized and the sacrificial layer may be formed on the planarized color filter layer with no planarization layer 43.

Figure 3D:
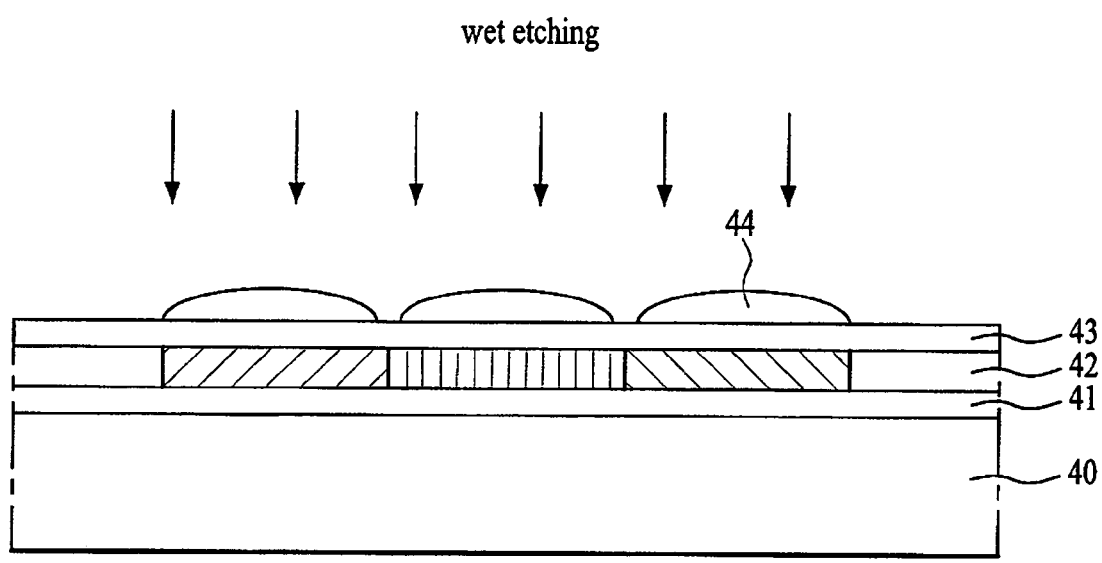

Referring to FIG. 3D, an isotropic etching process such as wet-etching is performed with respect to the lens-shaped sacrificial layer 44.

Figure 3E:
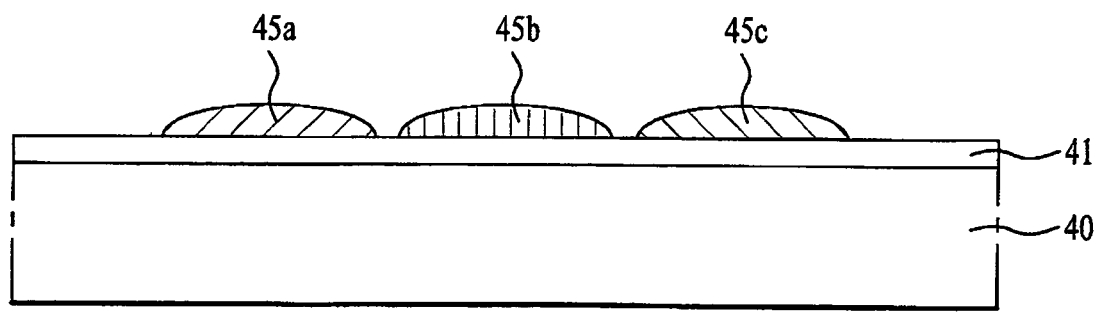

Referring to FIG. 3E, as a result of the wet etching process, the predetermined curvature of the lens-shaped sacrificial layer 44 is directly transferred to the underlying color filter layer 42, thereby forming a lens-shaped color filter layer comprised of lens-shaped color filters 45a, 45b, and 45c. In performing the wet etching process, the lens-shaped sacrificial layer 44 and the planarization layer 43 (if applied) are completely removed.

In the CMOS image sensor and the method for fabricating the same according to the present invention, each color filter of the color filter layer has a predetermined curvature for focusing incident light. The incident light is also transmitted onto a corresponding photodiode and filtered by the color filter layer according to wavelength. Thus, light is transmitted without the loss attributed to a microlens photoresist layer. This loss is eliminated in the present invention since the color filter layer functions as the microlens in the CMOS image sensor according to the present invention. Therefore, light transmissivity is improved.

In an exemplary embodiment of the present invention, the wet-etching process of the sacrificial layer pattern forming a predetermined curvature is used to form the same predetermined curvature in the color filter layer. This predetermined curvature in the color filter layer may also be realized without forming a sacrificial layer by directly patterning the colored resist for forming the color filter layer and then reflowing the patterned colored resist.

By adopting the CMOS image sensor and the method for fabricating the same according to the present invention, the microlens layer, which engenders a loss in light transmission energy, is not formed on the color filter layer so that a maximum amount of light for focusing on the photodiode can be realized. Therefore, photosensitivity of the device is improved. Thus, accordingly to the present invention, it is unnecessary to form an additional layer for focusing light via each color filter of the color filter layer. Specifically, there is no requirement for forming a microlens photoresist layer on a color filter layer. Accordingly, any attenuation in the light energy due to the presence of a microlens photoresist layer is avoided, and light is transmitted with no corresponding loss attributable to such a layer. Moreover, each of the color filters of the color filter layer has the desired predetermined curvature without forming an additional microlens layer, thus enabling a decrease in the overall height of the device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a CMOS image sensor comprising:
   forming a color filter layer comprised of a plurality of color filters for filtering light according to wavelength, wherein the plurality of color filters correspond to a plurality of photo-sensing elements formed in a semiconductor substrate;
   forming a sacrificial layer for microlens formation on the color filter layer;
   patterning the sacrificial layer to form a plurality of lens formation blocks corresponding to the plurality of color filters;
   reflowing the patterned sacrificial layer to impart each lens formation block with a predetermined curvature; and
   imparting each color filter of the plurality of color filters with a desired predetermined curvature corresponding to the predetermined curvature of the lens formation blocks by etching the patterned sacrificial layer and the color filter layer to completely remove the patterned sacrificial layer.

2. The method of claim 1, wherein the etching is an isotropic etching.

3. The method of claim 2, wherein the isotropic etching is a wet etching process.

4. The method of claim 1, wherein the color filter layer is planarized before forming said sacrificial layer.

5. The method of claim 1, further comprising:
   forming a planarization layer on the color filter layer before forming said sacrificial layer.

6. The method of claim 5, wherein the etching removes the planarization layer.

7. The method of claim 1, further comprising:
   forming an insulating interlayer covering the semiconductor substrate including said plurality of photo-sensing elements,
   wherein the color filter layer is formed on the insulating interlayer.

* * * * *